(12) United States Patent
Gomez

(10) Patent No.: US 7,412,222 B2
(45) Date of Patent: Aug. 12, 2008

(54) QUADRATURE CORRECTION METHOD FOR ANALOG TELEVISION RECEPTION USING DIRECT-CONVERSION TUNERS

(75) Inventor: Ramon A Gomez, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 381 days.

(21) Appl. No.: 10/441,057

(22) Filed: May 20, 2003

(65) Prior Publication Data

US 2004/0235443 A1 Nov. 25, 2004

(51) Int. Cl.
*H04B 1/16* (2006.01)
*H04N 5/20* (2006.01)

(52) U.S. Cl. ............... 455/324; 455/334; 455/200.1; 348/731

(58) Field of Classification Search .......... 455/324, 455/296, 304, 305, 308, 323, 333, 334, 126, 455/200.1, 150.1, 226.1; 375/340, 345, 346; 348/604, 720, 931

See application file for complete search history.

(56) References Cited

U.S. PATENT DOCUMENTS

| | | | |
|---|---|---|---|
| 4,340,975 A | | 7/1982 | Onishi et al. |
| 4,686,569 A | * | 8/1987 | Campbell et al. ........... 348/614 |
| 4,688,096 A | * | 8/1987 | Campbell et al. ........... 348/614 |
| 4,974,086 A | * | 11/1990 | Ehrhardt ..................... 348/738 |
| 5,200,826 A | | 4/1993 | Seong |
| 5,263,196 A | | 11/1993 | Jasper |
| 5,369,411 A | | 11/1994 | Lisle, Jr. |
| 5,737,035 A | * | 4/1998 | Rotzoll ....................... 348/725 |
| 5,847,612 A | | 12/1998 | Birleson |
| 5,930,696 A | | 7/1999 | Tzuang et al. |
| 5,999,802 A | * | 12/1999 | Aschwanden ............ 455/196.1 |
| 6,009,317 A | | 12/1999 | Wynn |
| 6,052,026 A | | 4/2000 | Tiller et al. ................. 330/254 |
| 6,137,999 A | | 10/2000 | Lovelace et al. ........... 455/302 |
| 6,160,572 A | | 12/2000 | Matsuura |
| 6,163,684 A | | 12/2000 | Birleson |

(Continued)

FOREIGN PATENT DOCUMENTS

EP 0 180 339 A2 5/1986

(Continued)

OTHER PUBLICATIONS

Michaels, J. et al., "Compensation of Frequency Dependent Quadrature Imbalance In a Zero-IF DownConverter", Motorola Technical Developments, Motorola Inc., vol. 38, pp. 183-186, Jun. 1999.

(Continued)

*Primary Examiner*—Blane J. Jackson
(74) *Attorney, Agent, or Firm*—Sterne, Kessler, Goldstein & Fox, P.L.L.C.

(57) ABSTRACT

A direct conversion radio frequency (RF) tuner includes a mixer generating I and Q quadrature components. A phase detection circuit generates a phase error measurement between the I quadrature component and the Q quadrature component. A phase correction circuit corrects a phase of the Q component based on the phase error measurement, and outputs a phase-corrected Q quadrature component. An I quadrature component gain control circuit receives the I quadrature component and outputting an amplitude corrected I quadrature component. A Q quadrature component gain control circuit receives the phase corrected Q quadrature component and outputs an amplitude corrected Q quadrature component.

18 Claims, 4 Drawing Sheets

U.S. PATENT DOCUMENTS

| | | | |
|---|---|---|---|
| 6,175,728 B1 | 1/2001 | Mitama | |
| 6,304,751 B1* | 10/2001 | King | 455/306 |
| 6,330,290 B1 | 12/2001 | Glas | |
| 6,377,620 B1* | 4/2002 | Ozluturk et al. | 375/235 |
| 6,484,042 B1 | 11/2002 | Loke | |
| 6,560,449 B1 | 5/2003 | Liu | |
| 6,895,045 B2* | 5/2005 | Ozluturk et al. | 375/235 |
| 6,940,930 B2* | 9/2005 | Brown et al. | 375/343 |
| 6,950,480 B2 | 9/2005 | Brown | |
| 7,020,220 B2 | 3/2006 | Hansen | |
| 7,038,733 B2 | 5/2006 | Dent | |
| 7,295,250 B2 | 11/2007 | Gomez et al. | |
| 2002/0007574 A1* | 1/2002 | Williams | 37/264 |
| 2002/0097812 A1 | 7/2002 | Wiss | |
| 2003/0003891 A1* | 1/2003 | Kivekas et al. | 455/313 |
| 2003/0007574 A1* | 1/2003 | Li et al. | 375/316 |
| 2003/0139167 A1* | 7/2003 | Ciccarelli et al. | 455/324 |
| 2003/0206603 A1 | 11/2003 | Husted | |
| 2004/0002323 A1* | 1/2004 | Zheng | 455/324 |
| 2004/0063416 A1* | 4/2004 | Kuenen et al. | 455/313 |
| 2004/0082300 A1* | 4/2004 | Scheck | 455/126 |
| 2004/0235445 A1 | 11/2004 | Gomez | |

FOREIGN PATENT DOCUMENTS

| | | | |
|---|---|---|---|
| EP | 0 719 013 A2 | 6/1996 | |
| EP | 0 840 484 A2 | 5/1998 | |
| EP | 0 863 606 A1 | 9/1998 | |
| EP | 0 948 128 A1 | 10/1999 | |
| EP | 0 964 557 A1 | 12/1999 | |
| EP | 1 063 767 A2 | 12/2000 | |
| EP | 1 172 928 A2 | 1/2002 | |
| WO | WO/ 98/32221 | 7/1998 | |
| WO | WO 01/15317 A1 | 3/2001 | |
| WO | WO 01/24358 A1 | 4/2001 | |

OTHER PUBLICATIONS

European Search Report for European Application No. EP 04 01 1413, issued on Aug. 13, 2004.

Aschwanden, Felix, "*Direct Conversion—How to Make It Work in TV Tuners,*" IEEE Transactions on Consumer Electronics, Aug. 1996, pp. 729-738, vol. 42, No. 3, (ISSN 0098-3063).

Suzuki, Hiroshi and Yoshino, Hitoshi, "*Affine Transformations for Compensating Linear Distortion: An Application to Linear Signaling in Mobile Radio,*" Electronics and Communications in Japan, Part I, vol. 75, No. 11, 1992, pp. 47-58; (*Translated from Denshi Joho Tsushin Gakkai Ronbunshi*, vol. 75-B-II, No. 1 Jan. 1992, pp. 1-9).

\* cited by examiner

QUADRATURE CORRECTION METHOD FOR ANALOG TELEVISION RECEPTION USING DIRECT-CONVERSION TUNERS

BACKGROUND OF THE INVENTION

1. Field of the Invention

The present invention relates to RF receivers, and more particularly, to direct conversion television tuners and receivers.

2. Description of the Related Art

Direct-conversion, or homodyne, receivers are today popular for many communications applications because of their simplicity and low power. They do not require intermediate-frequency (IF) filters, which are often costly, and need only one frequency conversion stage and one local oscillator (LO). Direct-conversion receivers rely entirely on quadrature mixing to obtain the necessary image rejection. The conversion gain and phase of the quadrature mixing stages must be precisely matched to obtain good image rejection.

At the frequencies used for direct broadcast satellite (DBS) transmissions (approximately 1-2 GHz), 40 dB of image rejection is about the maximum level of image rejection that can be achieved solely through component matching in practical integrated circuits.

This is adequate for the quadrature phase shift keying (QPSK) and 8-ary phase shift keying (8PSK) modulation formats used in these systems. However, analog television requires signal-to-noise ratios of about 50 dB for ideal image quality. As there are many contributors to the noise budget in realistic communication systems, the noise contribution from images must be on the order of 60 dB below the signal or better.

FIG. 1 shows a conventional direct conversion analog television tuner. As shown in FIG. 1, RF input is received by a low-noise amplifier 101. The RF input is then fed into mixers 102a, 102b. Phase-lock loop (PLL) 105 outputs a waveform at a specified frequency to the mixer 102a, and, through a 90-degree phase shifter 104, to the mixer 102b. Collectively, the mixers 102a, 102b, the PLL 105 and the phase shifter 104 may be referred to as a mixing stage 125.

The outputs of the mixing stage 105 are fed to low-pass filters 106a, 106b, and then to variable gain amplifiers 108a, 108b. The variable gain amplifiers 108a, 108b are in a closed loop that includes power detection circuits 109a, 109b, respectively. The outputs of the amplifiers 108a, 108b are the quadrature components I and Q, respectively.

The analog television spectrum contains a discrete tone at the picture carrier. This picture carrier will appear in the I and Q signals at the same frequency. Ideally, the I and Q picture carriers will be equal in amplitude and 90 degrees apart in phase. However, because of circuit imperfections, the I and Q picture carriers will have slightly different amplitudes and be somewhat more or less than 90 degrees apart. This is illustrated in the spectrums of FIG. 2.

As may be seen in FIG. 2, the I and the Q components are unbalanced. In this case, the amplitude of the Q component is larger than the amplitude of the I component by $\delta$, and is out of phase with the I component by $\phi$.

SUMMARY OF THE INVENTION

The present invention is directed to a quadrature correction method for analog television reception using direct-conversion tuners that substantially obviates one or more of the problems and disadvantages of the related art.

There is provided a direct conversion radio frequency (RF) tuner including a mixer generating I and Q quadrature components. A phase detection circuit generates a phase error measurement between the I quadrature component and the Q quadrature component. A phase correction circuit corrects a phase of the Q component based on the phase error measurement, and outputs a phase-corrected Q quadrature component. An I quadrature component gain control circuit receives the I quadrature component and outputting an amplitude corrected I quadrature component. A Q quadrature component gain control circuit receives the phase corrected Q quadrature component and outputs an amplitude corrected Q quadrature component.

In another aspect there is provided a method of balancing I and Q quadrature components including the steps of, during a horizontal sync signal (or during a vertical sync, or any other feature of the television signal where the amplitude and phase are known and constant), adjusting amplitude of the I quadrature component to a predetermined level using an automatic gain control circuit to generate a normalized I quadrature component; during the horizontal sync, generating a phase error of the normalized I quadrature component and the Q quadrature component; subtracting a product of the phase error and the I quadrature component from the Q quadrature component; and during the horizontal sync, adjusting an amplitude of the Q quadrature component to the amplitude of the normalized I quadrature component.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGS

The accompanying drawings, which are included to provide a further understanding of the exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

This invention includes an algorithm and integrated circuit implementation for automatically maintaining image rejection adequate for analog television reception with a direct-conversion tuner.

Conventional techniques have either been (1) applied to digital modulation formats with known constellations (2) or used test tones generated in the receiver. The present approach does not require a test tone generator, and provides a specific algorithm applicable to analog television signals.

Figure 1:
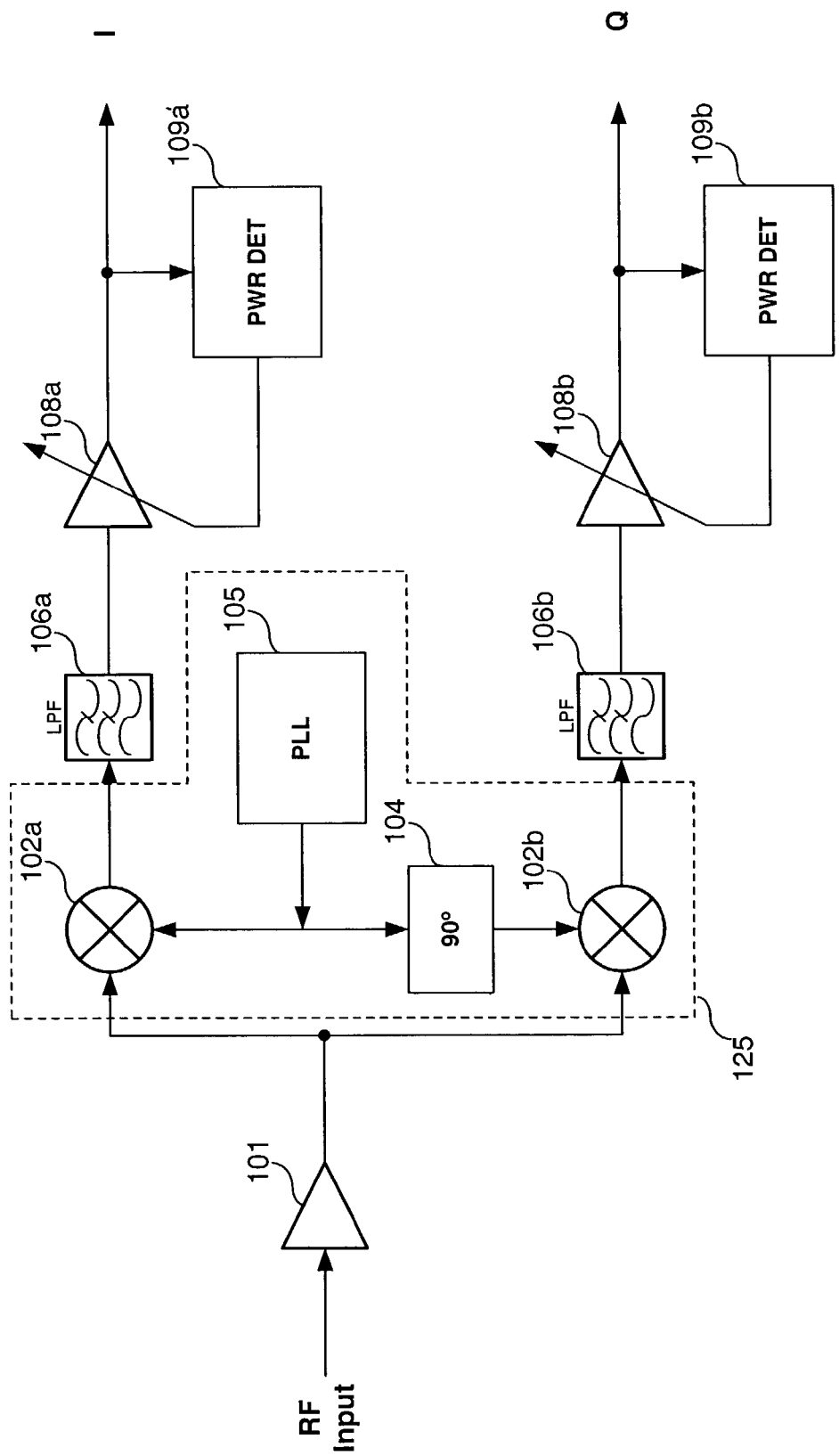
FIG. 1 shows a conventional conversion tuner that generates the I and Q quadrature components.
Figure 2:
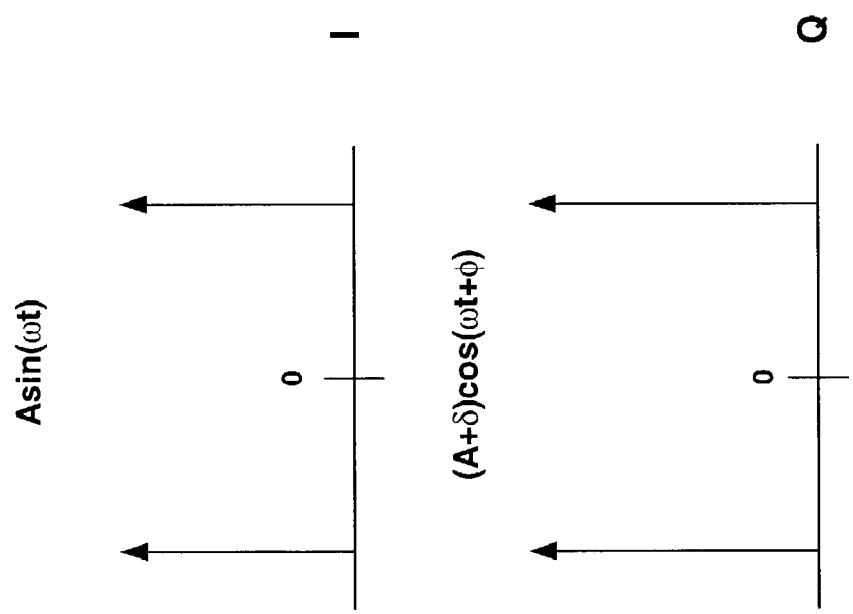
FIG. 2 shows an example of unbalanced I and Q components.
Figure 3:
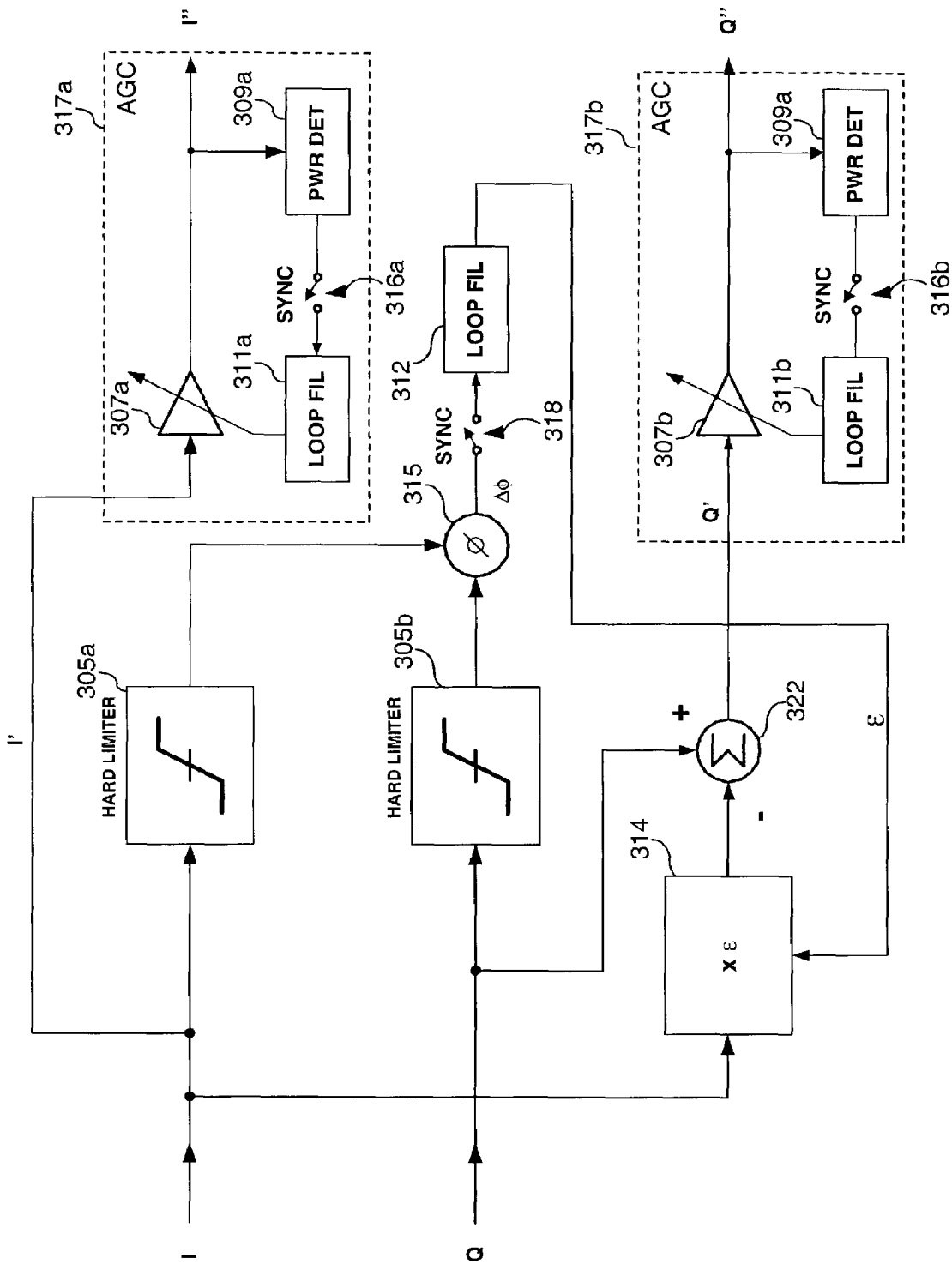
FIG. 3 shows a tuner of the present invention.

FIG. 3 illustrates a circuit that may be used to correct quadrature component imbalance. As shown in FIG. 3, the quadrature components I and Q are input into two hard limiters 305a and 305b, respectively. A limiter is a circuit that, for every time the value of the input is greater than zero, outputs a one, and for every time the output is less than zero, outputs a minus-one. The outputs of the hard limiters 305a, 305b are input into a phase difference detection circuit 315. The phase detection circuit outputs a zero when the phase difference between its inputs is exactly 90 degrees, and a $\Delta\phi$, which is a measure of the phase error. The $\Delta\phi$ is then fed through a synchronization switch 318, and a loop filter 312, to a multiplier 314. The multiplier 314 multiplies the I component and the phase error $\epsilon$, and outputs them to a summer 322, as shown in the figure. The second input to the summer 322 is the Q component. The output of the summer 322, Q', is fed to an automatic gain control stage 317b. The AGC stage 317b includes a variable gain amplifier 307b, a power detection circuit 309b, a synchronization switch 316b, and a loop filter 311b, which are connected in a feedback mechanism, as shown in the figure. The output of the AGC circuit 317b is Q", which has a corrected phase and amplitude relative to I". This may be referred to as using a phase correction circuit.

As further shown in FIG. 3, the quadrature component I (which in this case is the same as the quadrature component I') is inputted to an automatic gain control stage 317a, which, similar to the AGC stage 317b, includes a variable gain amplifier 307a, a power detection circuit 309a, a synchronization switch 316a, and a loop filter 311a, which are connected in a feedback loop. Note that the synchronization switch 316a is closed during the horizontal sync, and open at all other times. The output of the AGC circuit 317a is the amplitude- and phase-corrected quadrature component I". Note that in this circuit, the I and the Q components are amplitude-adjusted relative to an external reference, or a calibration voltage source, although they may also be adjusted relative to each other, i.e., the I quadrature component may be used as a reference for the Q quadrature component, or the components may be adjusted relative to the picture carrier in the signal. The circuit may be digitally controlled, as required, or may be analog controlled.

The correction algorithm is as follows. (The assumption is made that the horizontal sync signal has been extracted.)

Figure 4:
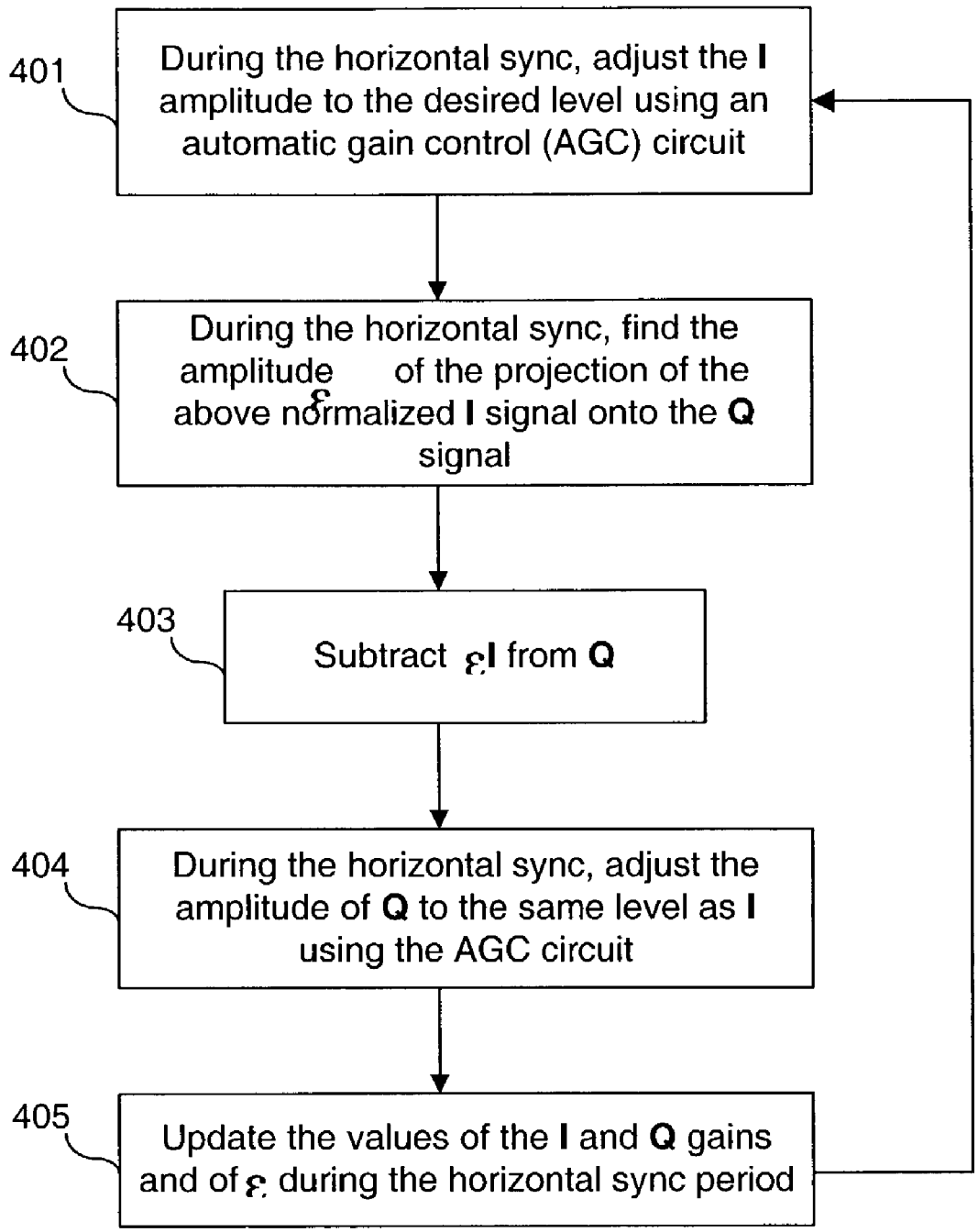
FIG. 4 shows a flow chart of a correction algorithm according to the present invention.

1. During the horizontal sync, adjust the I amplitude to the desired level using an automatic gain control (AGC) circuit 317a and the closing sychonization switch 316a (see FIG. 4, step 401).

2. During the horizontal sync, find the amplitude $\epsilon$ of the projection of the above normalized I signal onto the Q signal (see FIG. 4, step 402).

3. Subtract $\epsilon$I from Q (see FIG. 4, step 403).

4. During the horizontal sync, adjust the amplitude of Q to the same level as I using the automatic gain control circuit 317b (see FIG. 4, step 404).

5. Except during the horizontal sync period, the values of the I and Q gains and of $\epsilon$ do not need to be updated (see FIG. 4, step 405).

A block diagram of a circuit, that implements this algorithm continuously is shown in FIG. 3.

As shown in FIG. 3, a projection of I is subtracted with some gain $\epsilon$ from Q to form Q'. A phase detector 315, whose output is proportional to the phase difference between I and Q and equal to zero when the phase difference is equal to 90 degrees, updates the coefficient $\epsilon$. If the feedback polarity is correct, and the loop gain very high, this circuit will maintain very accurate quadrature. Note that it is much easier to detect quadrature at a baseband frequency of a few megahertz than to maintain quadrature balance in two RF mixers which must operate up to 860 MHz (the upper limit of the television band). The time delay corresponding to a given phase error is more than one hundred times less in the baseband case.

I and Q' are then leveled by AGC circuits 317a, 317b to produce I" and Q", which are the balanced outputs. These can now be processed in the conventional way to obtain a baseband analog signal with adequate image rejection.

Because the amplitude and phase imbalances in the quadrature mixer circuitry 125 change only very slowly over time, these feedback loops can have very narrow bandwidths and thereby can be very accurate.

All of the above processing can be done digitally, after the I and Q signals are digitized. Therefore, only the performance of the analog to digital converters (ADCs) and the resolution of the digital computations limit the accuracy of the algorithm.

Compared to conventional techniques for closed-loop quadrature correction in direct-conversion receivers, this technique relies on observations of the converted I and Q signals directly, and eliminates many sources of error associated with indirect measurements of quadrature balance. It can also be implemented as a simple analog or digital algorithm in the baseband processor of a TV viewer, without modifying the RF circuitry.

It will be understood by one of ordinary skill in the art that while the above discussion is primarily in terms of the horizontal sync signal, the invention would work equally well by using a vertical sync, or any other feature of the television signal where the amplitude and phase are known and constant.

Furthermore, the circuit can be tuned to operate on the picture carrier signal, which is present in standard analog TV signals. In other words, the I-Q correction described above can be performed on the picture carrier, and the rest of the I-Q components in the TV spectrum will be corrected as well. By updating the I-Q quadrature components only during the horizontal sync, rapid convergence of the algorithm described above may be achieved.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Also, the order of method steps may be rearranged. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A direct conversion radio frequency (RE) tuner for processing an input signal, comprising:
a mixer generating I and Q quadrature components;
a phase correction circuit generating a phase error measurement between the I quadrature component and the Q quadrature component, correcting a phase of the Q component based on the phase error measurement, and outputting a phase-corrected Q quadrature component;
an I quadrature component gain control circuit receiving the I quadrature component and outputting an amplitude corrected I quadrature component; and
a Q quadrature component gain control circuit receiving the phase corrected Q quadrature component and outputting an amplitude corrected Q quadrature component;
wherein respective gains of the I quadrature component gain control circuit and the Q quadrature gain control circuit are determined when the input signal includes one of a horizontal sync signal or vertical sync signal.

2. The tuner of claim 1, wherein the phase correction circuit includes:
a first hard limiter receiving the Q quadrature component and outputting a first modified Q quadrature component;
a second hard limiter receiving the I quadrature component and outputting a first modified I quadrature component;
a phase detection circuit receiving the first modified Q quadrature component and the first modified I quadrature component and outputting an error signal;
a first loop filter filtering the error signal;
a circuit generating a product of the error signal and the I quadrature component; and
a summer receiving the Q quadrature component and the product of the error signal and the I quadrature component and outputting the phase corrected Q quadrature component.

3. The tuner of claim 1, wherein the Q quadrature component gain control circuit includes a variable gain amplifier, and a power detection circuit and a loop filter connected to the variable gain amplifier in a feedback loop.

4. The tuner of claim 1, wherein the I quadrature component gain control circuit includes a variable gain amplifier, and a power detection circuit and a loop filter connected to the variable gain amplifier in a feedback loop.

5. The tuner of claim 1, wherein the I quadrature component gain control circuit outputs the amplitude corrected I quadrature component corrected relative to the phase corrected Q quadrature component.

6. The tuner of claim 1, wherein the I quadrature component gain control circuit outputs the amplitude corrected I quadrature component corrected relative to a reference voltage; and
wherein the Q quadrature component gain control circuit outputs the amplitude corrected Q quadrature component corrected relative to the reference voltage.

7. The tuner of claim 1, wherein the I quadrature component gain control circuit outputs the amplitude corrected I quadrature component that is corrected relative to the Q quadrature component.

8. A direct conversion radio frequency (RF) tuner for processing an input signal, comprising:
a mixer generating I and Q quadrature components;
a phase correction circuit generating a phase error measurement between the Q quadrature component and the I quadrature component, correcting a phase of the I component based on the phase error measurement, and outputting a phase-corrected I quadrature component;
a Q quadrature component gain control circuit receiving the Q quadrature component and outputting an amplitude corrected Q quadrature component; and
an I quadrature component gain control circuit receiving the phase corrected I quadrature component and outputting an amplitude corrected I quadrature component;
wherein respective gains of the I quadrature component gain control circuit and the Q quadrature gain control circuit are determined when the input signal includes one of a horizontal sync signal or vertical sync signal.

9. The tuner of claim 8, wherein the phase correction circuit includes:
a first hard limiter receiving the I quadrature component and outputting a first modified I quadrature component;
a second hard limiter receiving the Q quadrature component and outputting a first modified Q quadrature component;
a phase detection circuit receiving the first modified I quadrature component and the first modified Q quadrature component and outputting an error signal;
a first loop filter filtering the error signal;
a circuit generating a product of the error signal and the Q quadrature component; and
a summer receiving the I quadrature component and the product of the error signal and the Q quadrature component and outputting the phase corrected I quadrature component.

10. The tuner of claim 8, wherein the I quadrature component gain control circuit includes a variable gain amplifier, and a power detection circuit and a loop filter connected to the variable gain amplifier in a feedback loop.

11. The tuner of claim 8, wherein the Q quadrature component gain control circuit includes a variable gain amplifier, and a power detection circuit and a loop filter connected to the variable gain amplifier in a feedback loop.

12. The tuner of claim 8, wherein the Q quadrature component gain control circuit outputs the amplitude corrected Q quadrature component corrected relative to the phase corrected I quadrature component.

13. The tuner of claim 8, wherein the Q quadrature component gain control circuit outputs the amplitude corrected Q quadrature component corrected relative to a reference voltage; and
wherein the I quadrature component gain control circuit outputs the amplitude corrected I quadrature component corrected relative to the reference voltage.

14. The tuner of claim 8, wherein the Q quadrature component gain control circuit outputs the amplitude corrected Q quadrature component that is corrected relative to the I quadrature component.

15. A method of balancing I and Q quadrature components, comprising:
during a horizontal sync signal, adjusting an amplitude of the I quadrature component to a predetermined level using an automatic gain control circuit to generate a normalized I quadrature component;
during the horizontal sync signal, generating a phase error of the normalized I quadrature component and the Q quadrature component;
subtracting a product of the phase error and the I quadrature component from the Q quadrature component; and
during the horizontal sync signal, adjusting an amplitude of the Q quadrature component to an amplitude of the normalized I quadrature component.

16. A method of balancing I and Q quadrature components, comprising:

during a vertical sync signal, adjusting an amplitude of the I quadrature component to a predetermined level using an automatic gain control circuit to generate a normalized I quadrature component;

during the vertical sync signal, generating a phase error of the normalized I quadrature component and the Q quadrature component;

subtracting a product of the phase error and the I quadrature component from the Q quadrature component; and during the vertical sync signal, adjusting an amplitude of the Q quadrature component to an amplitude of the normalized I quadrature component.

17. A direct conversion radio frequency (RF) tuner for processing an input signal, comprising:

a mixer generating I and Q quadrature components;

a phase correction circuit generating a phase error measurement between the I quadrature component and the Q quadrature component, correcting a phase of the Q component based on the phase error measurement, and outputting a phase-corrected Q quadrature component;

an I quadrature component gain control circuit receiving the I quadrature component and outputting an amplitude corrected I quadrature component; and a Q quadrature component gain control circuit receiving the phase corrected Q quadrature component and outputting an amplitude corrected Q quadrature component;

wherein the phase correction circuit includes, a first hard limiter receiving the Q quadrature component and outputting a first modified Q quadrature component;

a second hard limiter receiving the I quadrature component and outputting a first modified I quadrature component;

a phase detection circuit receiving the first modified Q quadrature component and the first modified I quadrature component and outputting an error signal;

a first loop filter filtering the error signal;

a circuit generating a product of the error signal and the I quadrature component; and a summer receiving the Q quadrature component and the product of the error signal and the I quadrature component and outputting the phase corrected Q quadrature component.

18. A direct conversion radio frequency (RF) tuner for processing an input signal, comprising:

a mixer generating I and Q quadrature components;

a phase correction circuit generating a phase error measurement between the Q quadrature component and the I quadrature component, correcting a phase of the I component based on the phase error measurement, and outputting a phase-corrected I quadrature component;

a Q quadrature component gain control circuit receiving the Q quadrature component and outputting an amplitude corrected Q quadrature component;

an I quadrature component gain control circuit receiving the phase corrected I quadrature component and outputting an amplitude corrected I quadrature component;

wherein the phase correction circuit includes, a first hard limiter receiving the I quadrature component and outputting a first modified I quadrature component;

a second hard limiter receiving the Q quadrature component and outputting a first modified Q quadrature component;

a phase detection circuit receiving the first modified I quadrature component and the first modified Q quadrature component and outputting an error signal;

a first loop filter filtering the error signal;

a circuit generating a product of the error signal and the Q quadrature component; and a summer receiving the I quadrature component and the product of the error signal and the Q quadrature component and outputting the phase corrected I quadrature component.

* * * * *

UNITED STATES PATENT AND TRADEMARK OFFICE
CERTIFICATE OF CORRECTION

PATENT NO. : 7,412,222 B2 Page 1 of 1
APPLICATION NO. : 10/441057
DATED : August 12, 2008
INVENTOR(S) : Ramon A. Gomez It is certified that error appears in the above-identified patent and that said Letters Patent is hereby corrected as shown below:

In Column 5, line 4, "(RE)" should be replaced with -- (RF) --.

Signed and Sealed this

Nineteenth Day of May, 2009

JOHN DOLL
*Acting Director of the United States Patent and Trademark Office*